United States Patent
Marquez et al.

(10) Patent No.: US 9,503,294 B1
(45) Date of Patent: Nov. 22, 2016

(54) AMPLITUDE AND PHASE SHIFT KEYING MODULATION FOR SATURATED AMPLIFIER SYSTEMS

(71) Applicant: NORTHROP GRUMMAN SYSTEMS CORPORATION, Falls Church, VA (US)

(72) Inventors: Marlon E. Marquez, Torrance, CA (US); Douglas S. Cockfield, Newport, OR (US); Gerald R. Fischer, Luray, VA (US); Matthew M. D'Amore, Los Angeles, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/182,452

(22) Filed: Jun. 14, 2016

(51) Int. Cl.
| | | |
|---|---|---|
| H04B 1/04 | (2006.01) | |
| H04L 27/36 | (2006.01) | |
| H04L 27/24 | (2006.01) | |
| H04L 27/00 | (2006.01) | |
| H04L 27/34 | (2006.01) | |
| H04B 1/717 | (2011.01) | |

(52) U.S. Cl.
CPC ......... H04L 27/0008 (2013.01); H04B 1/0475 (2013.01); H04L 27/3405 (2013.01); H04L 27/368 (2013.01); H04B 1/7172 (2013.01); H04B 2001/045 (2013.01)

(58) Field of Classification Search
CPC .......... H04B 1/71635; H04B 1/71637; H04B 1/7172; H04B 1/7174
See application file for complete search history.

(56) References Cited

U.S. PATENT DOCUMENTS

| | | |
|---|---|---|
| 6,993,087 B2 | 1/2006 | Rosnell et al. |
| 7,242,707 B1 | 7/2007 | Miao |
| 7,362,824 B1 | 4/2008 | Murakami et al. |
| 7,369,598 B2 | 5/2008 | Fontana et al. |
| 7,657,238 B2 * | 2/2010 | Grange ...................... H03F 3/24 375/297 |
| 8,750,424 B2 | 6/2014 | Futami et al. |
| 9,031,168 B1 | 5/2015 | Liu |
| 2002/0180547 A1 * | 12/2002 | Staszewski ............... H03F 1/02 332/115 |
| 2015/0364819 A1 | 12/2015 | Ngo et al. |
| 2015/0372852 A1 | 12/2015 | Delaruelle |

OTHER PUBLICATIONS

Ali, Sheikh Nijam, "A New High Efficiency RF Switch-Mode Power Amplifier Architecture for Pulse Encoded Signals" IEEE WAMICON Conference, Apr. 2012, 6 pgs.
Maroldt, Stephan, "Gallium Nitride Based Transistors for High-Efficiency Microwave Switch-Mode Amplifiers" Dissertation, University of Freibur Im Breisgau, Germany, Jun. 2010, 177 pgs.
Kee, Scott D. "The Class-E/F Family of ZVS Switching Amplifiers" IEEE Transactions on Microwave Theory and Techniques, vol. 51, No. 6, Jun. 2003, pp. 1677-1690.

* cited by examiner

*Primary Examiner* — Ross Varndell
(74) *Attorney, Agent, or Firm* — John A. Miller; Miller IP Group, PLC

(57) ABSTRACT

An amplitude and phase modulation circuit for modulating an M-ary digital signal having pulses onto a carrier wave for transmission by direct digital synthesis. The modulation circuit includes a digital source that generates a digital signal including pulses representing logical 1s and no pulses representing logical zeros, where a group of M pulses represents a constellation point to be transmitted. The modulation circuit further includes a phase control circuit that provides phase control and an amplitude control circuit that provides pulse width control for the constellation point to be transmitted. A saturated amplifier amplifies the phase and amplitude controlled digital signal and a filter integrates and averages the digital signal to remove noise from the signal so as to convert the digital signal to an analog signal, where the digital source operates to reduce the amplifier power consumption requirements.

20 Claims, 4 Drawing Sheets

AMPLITUDE AND PHASE SHIFT KEYING MODULATION FOR SATURATED AMPLIFIER SYSTEMS

BACKGROUND

Field

This invention relates generally to system and method for providing amplitude and phase modulation of a digital signal to be amplified by a saturated amplifier and, more particularly, to a system and method for providing amplitude and phase modulation of a digital signal to be amplified by a saturated amplifier to reduce amplifier power requirements, where the phase modulation is provided by selectively delaying the digital signal using a plurality of delay lines and the amplitude modulation is provided by selectively changing the pulse width of pulses in the digital signal.

DISCUSSION

Data and communications signals sent between various devices and systems, such as cellular signals, satellite uplink and downlink signals, satellite cross-link signals, etc., are modulated onto a carrier wave at various modulation frequencies. Well known modulation techniques for these systems include phase shift keying (PSK), amplitude shift keying (ASK), binary phase shift keying (BPSK), quadrature phase shift keying (QPSK), etc. One popular modulation technique is pulse time modulation (PTM) that encodes sample values of an analog signal onto a time axis of a digital signal, and includes pulse width modulation (PWM) and pulse position modulation (PPM). In PWM, the sample values of the analog waveform are used to determine the width of the pulse. For digital PWM techniques, the phase shift of the signal is obtained by reconfiguring the logical zeros and ones in the signal that is being transmitted. M-ary pulse position modulation (PPM) includes encoding N message bits on the signal by transmitting a single signal pulse in one of a group of M possible time slots, where the group of M time slots is referred to as a constellation symbol.

Typically, the modulated signal that is transmitted is amplified by an amplifier that operates in the linear region in order to reduce the effects of noise, inter-symbol interference, etc. caused by the harmonics generated by the non-linear operation. However, when operating the amplifier in the linear region, the amplifier is always on and therefore always consuming power, where optimum power efficiency only occurs when the amplifier is operating at its maximum output power. In order to reduce the power consumption of such amplifiers, it is known in the art to employ saturated amplifier technologies where the amplifier operates in its saturated region where the amplifier is only on when a pulse is being transmitted. More specifically, when the amplifier receives a digital one value it turns on and when the amplifier receives a digital zero value it turns off, which reduces power consumption.

DETAILED DESCRIPTION OF THE EMBODIMENTS

The following discussion of the embodiments of the invention directed to a system and method for providing amplitude and phase modulation of a digital signal that is to be amplified by a saturated amplifier is merely exemplary in nature, and is in no way intended to limit the invention or its applications or uses.

Figure 1:
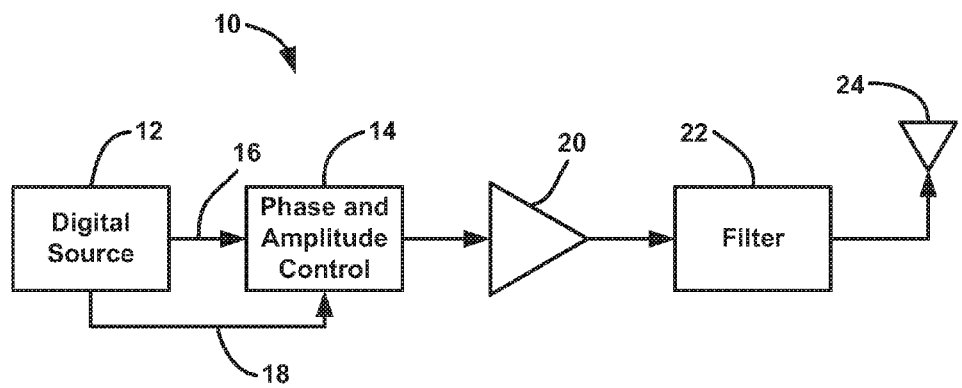
FIG. 1 is a schematic block diagram of a modulation circuit for modulating a digital signal onto an analog carrier wave.
Figure 2:
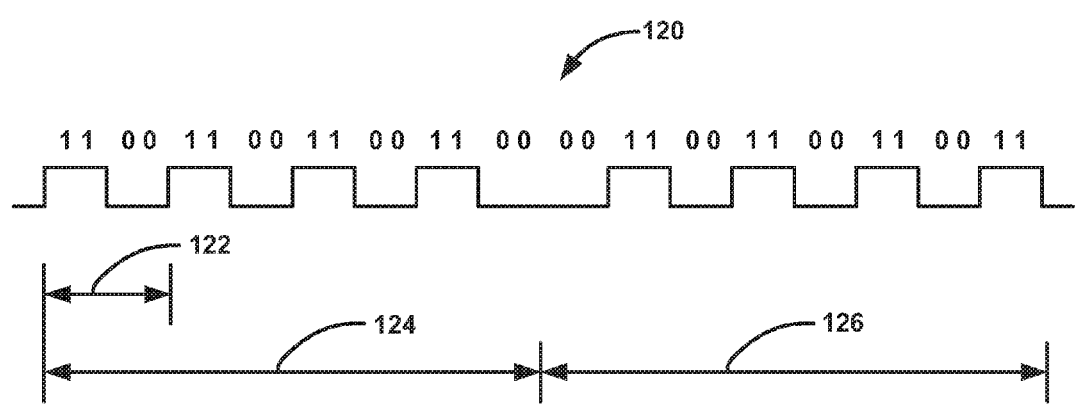
FIG. 2 is a timing diagram showing a typical oversampled digital output stream.

FIG. 1 is a schematic block diagram of a modulation circuit 10 that provides amplitude and phase modulation, such as PPM/PWM, for transmitting digital data bits on an analog signal for wireless transmission to a receiver (not shown) using direct digital synthesis (DDS) where no analog mixers are required. The circuit 10 includes a digital source 12 that generates a modulated digital output stream, such as, for example, signal 120 shown in FIG. 2 composed of square-wave pulses. Generally, the signal to be transmitted is encoded and modulated onto a carrier of higher frequency with X carrier periods per symbol, for example, for the GPS L1 band the carrier is 154 times the symbol rate. The desired carrier, which may be oversampled, is generated at the final carrier frequency by the digital source 12, where each pulse represents a logical 1 or consecutive logical 1s and locations that do not include a pulse represent a logical zero or consecutive logical zeros. The encoded baseband data is therefore represented in the output digital data as a continuous stream of symbols with modulation of multiple carrier periods per symbol. For the signal 120, a first symbol 124 consists of four carrier periods 122 that are oversampled by 4:1 and represented by the repeating digital stream 1-1-0-0. A second symbol 126 consists of four carrier periods 122 that are represented by the repeating digital stream 0-0-1-1 and represents a phase shift of 180 degrees relative to symbol 124. Such a phase shift could be used to define the two phases in a BPSK modulation application with 4× oversampling, or as defining two of the possible phases in a QPSK modulation application, where 1-0-0-1 and 0-1-1-0 are the remaining two states. As will be discussed, the digital source 12 can be controlled to selectively provide and not provide digital data at particular points in time so that digital data is dropped and gain control can be provided.

The stream of digital pulses in the digital signal are provided on line 16 to a phase and amplitude control circuit 14 that delays the digital data some period of time to provide phase shifts and/or changes the width of the pulses to provide amplitude shifts, as will be discussed in further detail below. A control signal on line 18 from the digital source 12 to the circuit 14 controls the phase delay and/or width of the digital signal provided on the line 16. The phase and amplitude controlled digital signal from the circuit 14 is provided to an amplifier 20 that amplifies the signal, where the amplifier 20 operates using saturated amplifier technology so that it is only consuming power when it receives a logical 1 pulse in the signal. The amplifier 20 can be any amplifier suitable for the purposes discussed herein, such as a solid state power amplifier (SSPA) or a traveling-wave tube amplifier (TWTA). It is noted that when saturated the amplifier 20 becomes part of the digital signal path. The amplified digital signal from the amplifier 20 is provided to a bandpass filter 22 that integrates and averages the signal to produce an analog sine wave signal that is transmitted by an antenna 24. The filter 22 can be any filter suitable for the purposes discussed herein, such as a high Q filter. The filter 22 is designed to achieve the desired properties of the transmitted modulated carrier, such as band edges, flatness, rise and fall times, etc., and reject out of band harmonics and spurious products resulting from operating the amplifier 20 in saturation. The filter 22 can further be optimized to aid the amplifier 20 in recovering the power in the out of band harmonic products that would otherwise be wasted.

Figure 3:
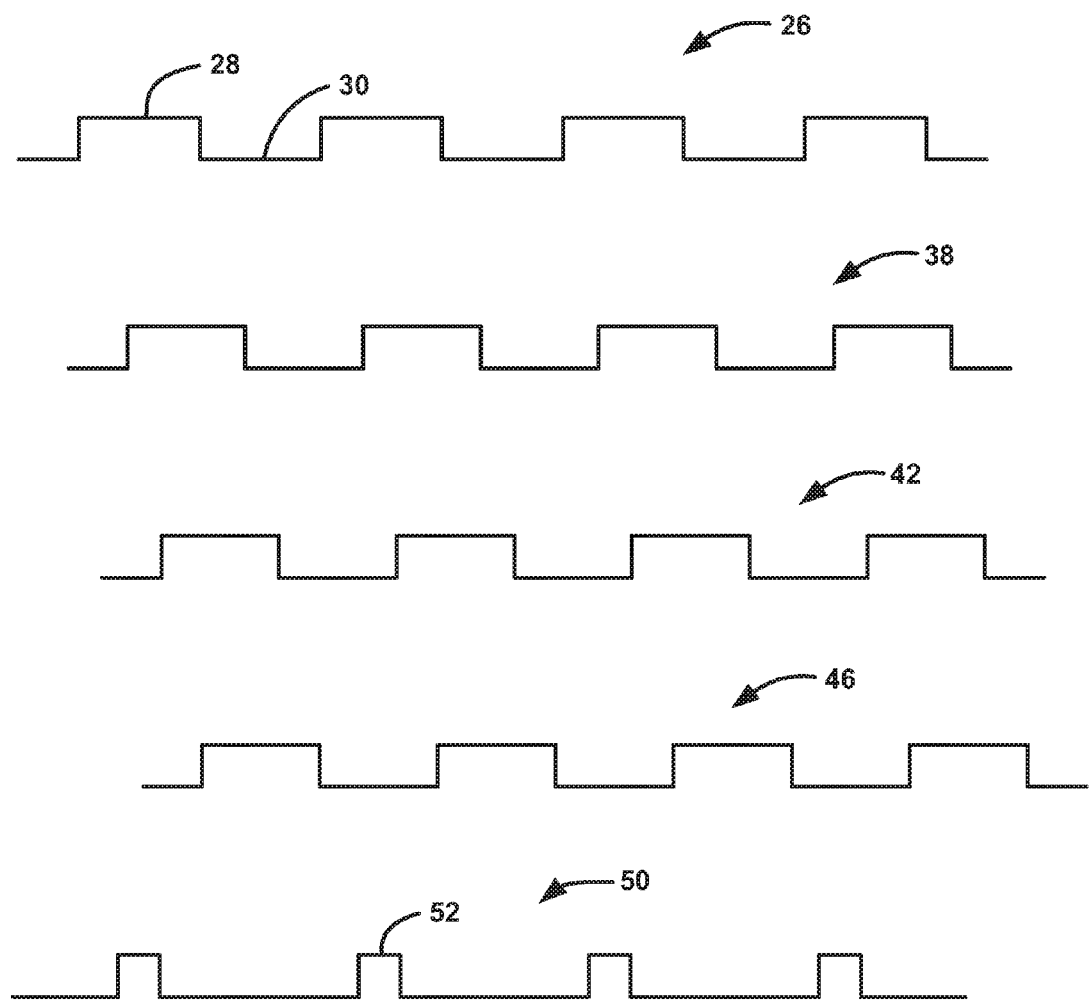
FIG. 3 is a timing diagram showing five digital signals identified by a carrier phase.

FIG. 3 is a timing diagram showing a number of square-wave digital signals to illustrate how the control circuit 14 delays and/or changes the width of the digital signals from the digital source 12 to transmit different constellation points for a 4-ary modulation scheme, where M is 4. Although the example discussed herein is a 4-ary modulation scheme, it will be appreciated by those skilled in the art that the modulation techniques of the invention can be extended to any suitable M-ary modulation system. In this non-limiting example, the digital source 12 generates a 4-ary digital signal 26 identified by a carrier phase having logical values 1-1-0-0, where each pulse 28 in the digital signal 26 represents two consecutive logical 1s and each low 30 in the signal 26 represents two consecutive logical zeros. For illustration purposes, the digital signal 26 is shown to be oversampled four times (4x), where each constellation symbol is consecutively transmitted by 4x. The digital carrier pattern 1-1-0-0 is repeated for the duration of the symbol, in this example four times or more.

Figure 4:
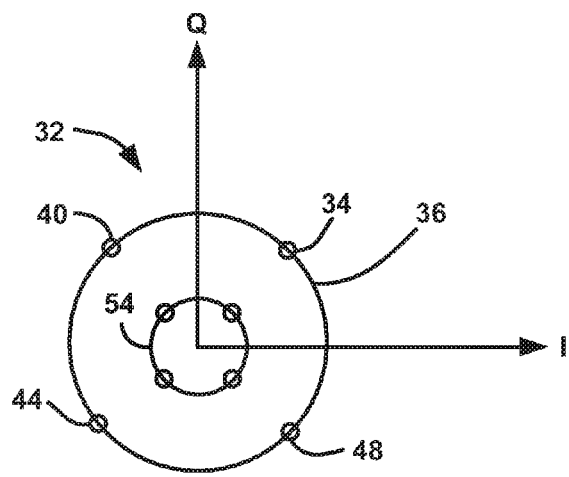
FIG. 4 is a graph of an ideal complex coded digital signal symbol constellation, where in-phase values are on the horizontal axis and quadrature-phase values are on the vertical axis.

FIG. 4 is an illustration of a complex symbol constellation 32 where in-phase values are on the horizontal and quadrature-phase values are on the vertical axis, and where each constellation point on a ring represents a single data sample being transmitted and the number of M points on the ring identifies the M-ary modulation. By delaying the transmission of the digital signal some period of time relative to the defined symbol start and stop time, the constellation point to be transmitted can be rotated around the ring and by changing the width of the pulses in the digital signal, the constellation points can be transmitted on a different ring having a different diameter. For example, for the carrier phase 1-1-0-0 of the digital signal 26 and having the pulse width shown, constellation point 34 on ring 36 is transmitted. By delaying the signal 26 one clock period so that the carrier period 0-1-1-0 is transmitted as shown by digital signal 38, constellation point 40 on the ring 36 is transmitted. Likewise, by delaying the signal 26 two clock periods so that the carrier period 0-0-1-1 is transmitted as shown by digital signal 42, constellation point 44 on the ring 36 is transmitted. And, by delaying the digital signal 26 three clock periods so that the carrier period 1-0-0-1 is transmitted as shown by digital signal 46, constellation point 48 on the ring 36 is transmitted. If the pulses 28 are narrowed, as shown by digital signal 50 having narrow pulses 52, then the carrier power seen at the filter output is reduced and the constellation points are transmitted on a smaller diameter ring 54. This technique is described in detail below for a 1-1-0-0 sequence reduced half width to a 1-0-0-0 sequence, which results in half the power at the antenna 24.

Figure 5:
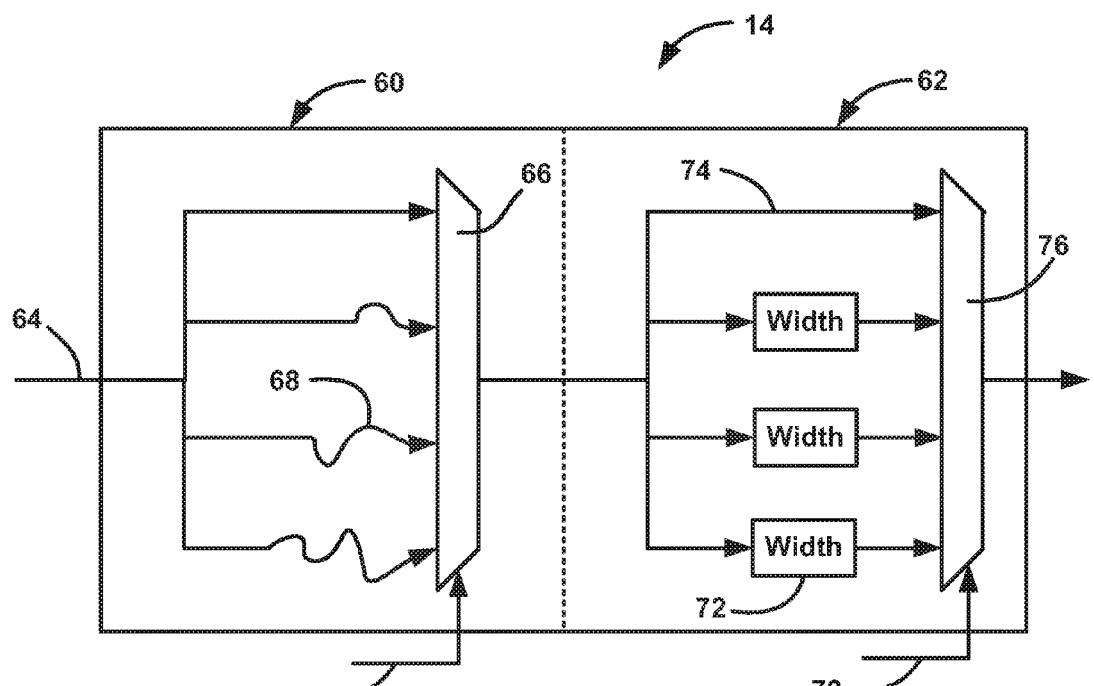
FIG. 5 is a schematic block diagram of a phase and amplitude control circuit shown in the modulation circuit in FIG. 1.

FIG. 5 is a detailed block diagram of the control circuit 14 that includes an overall phase control (time delay) portion 60 and an amplitude control portion 62 to show one non-limiting example of how the M-ary 4x oversampled digital signal from the digital source 12 can be phase and amplitude controlled. It is noted that separate phase and amplitude control functions are used, however, in a digital design utilizing a custom integrated circuit or field programmable gate array these two functions may be combined to achieve the same result with fewer components. The digital signal from the digital source 12 is provided on line 64 to a plurality of delay paths 68 in the phase control portion 60, where each delay path 68 has a different clock latency and delay length to produce whole plus any required fractional clock shifts in the time that each of the digital signals reaches a multiplexer 66. The phase control portion 60 will include a separate delay line for each M number of values in the M-ary modulation scheme, where in this example, it is a 4-ary modulation scheme. A path 68 (clock phase) consists of a combination digital shift register and analog delay line. Delay is achieved by a combination of whole clock periods where oversampling is used, plus any additional delay values needed for fractions of a clock period. A phase control signal on line 70 from the digital source 12 causes the multiplexer 66 to select one of the delayed digital signals on the line 64 at any particular point in time to provide the symbol point to be transmitted. It is noted that in the example provided the plurality of delay lines N is equal to the M-ary number of states, but N may be much greater than the number of M-ary modulation states in order to achieve a fine phase resolution control as would be employed in a multi-element phased array antenna, or to achieve time delay correction or calibration to offset temperature effects or adjust satellite station keeping. A single 4:1 multiplexer is shown for example, however, a series of combination of digital and analog delay multiplexers may be employed to achieve a high total number of selectable delay states with fine resolution.

As mentioned, a typical constellation for an M-ary modulation scheme will include multiple concentric rings, where a symbol point to be transmitted at any particular point in time can not only be at a particular rotational orientation on a ring for phase control, but can also be moved to a smaller or larger ring in the constellation for amplitude control, including pre-distortion techniques for TWTA nonlinearity. In order to provide a shift from one constellation ring to another constellation ring, the control circuit 14 controls the width of the pulses where the narrower the pulse, the closer the ring is to the center of the constellation diagram. Particularly, the selected digital signal from the multiplexer 66 is provided to a plurality of pulse width adjuster circuits 72 in the amplitude control portion 62 that adjust the width of the pulses provided, where each of the circuits 72 changes the width of the pulses to a different value. The pulse width can be the same for the entire duration of the symbol as shown by the signal 50, or can vary pulse to pulse. This pulse width adjustment can be achieved by changing a combination of whole clock periods where oversampling is used, and fractions of a clock period using additional delay lines as in the phase control where finer resolution is desired.

In this non-limiting example, there are three of the width adjust circuits 72, where the three width adjusted pulses along with a non-width adjusted pulse on line 74 are provided to a multiplexer 76. An amplitude control signal on line 78 from the digital source 12 is provided to the multiplexer 76 to select which of the width controlled pulses will be output to the amplifier 20 to select which symbol point is to be transmitted. The actual period of the waveform provided to the amplitude control portion 62 remains the same. By reducing the width of the pulses provided to the amplifier 20, the power used by the amplifier 20 is reduced and the filter 22 will integrate less energy. Out of band harmonics generated depend on whether the pulse width is kept the same for the entire symbol period or is varied on a carrier period-by period basis. In general, the harmonics are far enough away from the desired signal band edges to be easily filtered out.

Figure 6:
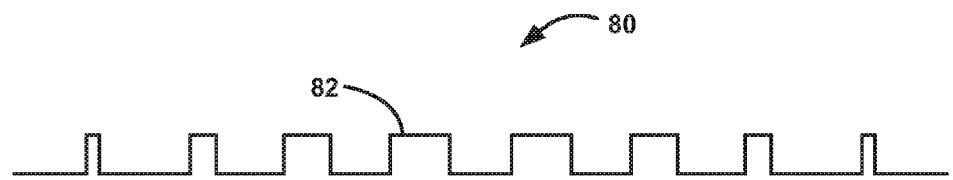
FIG. 6 is a timing diagram of a digital signal that has been tapered to reduce spurious output filtering requirements.

The amount of power use by the amplifier 20 can be further reduced through other modulation techniques. For example, in another embodiment, the digital source 12 provides signal tapering of the pulses in the digital signal to reduce the requirements of the spectral content of the filter 22. FIG. 6 is an illustration of a digital signal 80 having pulses 82 provided by the digital source 12 that are gradually tapered in width across the carrier period in order to contain the spectral content to show this embodiment. By gradually tapering the width of the pulses 82 in this manner at the transition ends of a symbol (windowing), pre-filtering of the signal 80 can be obtained at the symbol-to-symbol boundary and the complexity and performance of the filter 22 can be reduced without loss of performance. Pulse tapering has a similar spectral effect to using a fast Fourier transform (FFT) for analog-to-digital converter (ADC) signal-to-noise ratio (SNR) testing, where a data window, such as Hamming, is used on a finite length data capture so as to reduce the amplitude of the samples at the start and stop of the sequence, and thus minimize spurious harmonics that result from using a finite number of ADC samples. The spurs resulting from tapering are usually modulated at multiples of the digital sampling rate, and therefore far away from the desired signal band edges.

Figure 7:
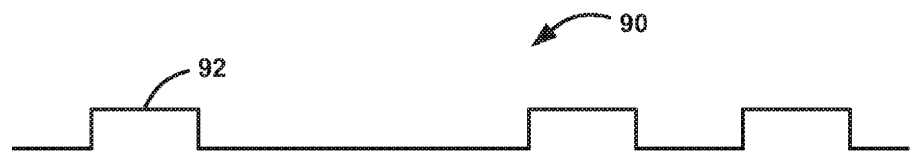
FIG. 7 is a timing diagram of a digital signal that has been decimated to reduce amplifier power requirements.

In another embodiment, the digital signal generated by the digital source 12 is decimated where every predetermined time period, such as a single carrier period, the pulses representing logical 1s are dropped, which reduces the power requirements of the amplifier 20. For example, for a 4× oversampled signal, the carrier phase 1-1-0-0, would be transmitted as 1-1-0-0-1-1-0-0-1-1-0-0-1-1-0-0, where one of the symbols would be replaced with 0-0-0-0 to reduce the output power. Such decimation would not need to be continuous, where the decimation would only occur every so often. The integration effect of the filter 22 would average out over time where the decimated carrier period would not be noticed. FIG. 7 is an illustration of a digital signal 90 having pulses 92 provided by the digital source 12 where one of the symbol pulses has been decimated to show this embodiment. This effect is especially pronounced where the ratio of the carrier to baseband signal is high and when the carrier signal is oversampled.

Figure 8:
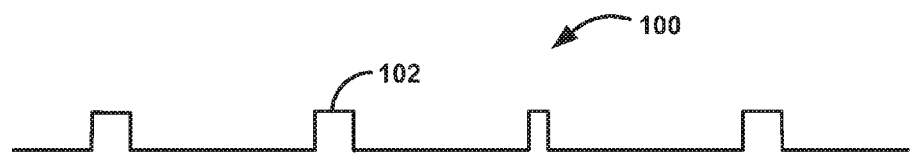
FIG. 8 is a timing diagram of a digital signal that includes excised pulses to reduce amplifier power requirements.

In yet another embodiment, the digital source 12 can perform carrier excision where the particular carrier period, such as 1-1-0-0 in this example, has one of the bits excised so that the transmitted carrier period is 1-0-0-0, and is therefore half width. In a repetitive 1-0-0-0 excised sequence, the fundamental and odd harmonic powers reduced by one-half (3 dB) and some of the total power shifts to generation of even harmonics not present in the original 1-1-0-0 square-wave pulse. This phenomenon is readily apparent to those familiar with coefficients of a Fourier series generated by a repetitive digital sequence. Since the bandpass filter 22 rejects all power except the modulated signal centered at the carrier fundamental frequency, the apparent output power at the antenna 24 is reduced by 3 dB (half power). FIG. 8 is an illustration of a digital signal 100 having excised pulses 102 provided by the digital source 12 to show this embodiment. Although the amount of energy sent to the filter 22 has been reduced, the phase center has been shifted. This shift can be corrected by adding a time shift circuit (not shown), where the data generator knows the a-priori of the carrier decimation, and thus can provide a previously known calibration delay. The phase control signal line can provide this correction in the residual phase offset real-time.

Figure 9:
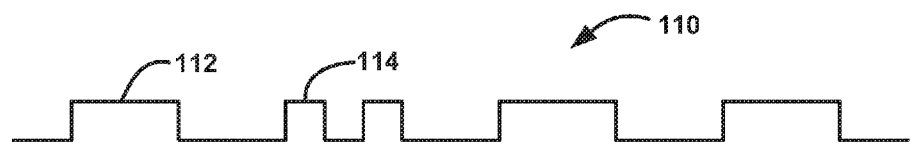
FIG. 9 is a timing diagram of a digital signal including double-frequency pulses to reduce amplifier power requirements.

In another embodiment, the digital sequence is further oversampled such that data excision makes a finer reduction of power and the resulting spurious harmonics generated can be filtered out by the filter 22 more easily because the effective sample rate has been increased and the resulting sampling images are further away from the desired signal. Each one of these power reduction techniques causes the symbol point that is transmitted to be on a smaller ring in the constellation. FIG. 9 is an illustration of a digital signal 110 having pulses 112 provided by the digital source 12 to show this embodiment.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An amplitude and phase modulation circuit for modulating an M-ary digital signal having pulses, said modulation circuit comprising:
   a digital source generating a digital signal including pulses representing logical 1s and no pulses representing logical zeros, where a group of M pulses represents a constellation point to be transmitted;
   a phase control circuit responsive to the digital signal from the digital source, said phase control circuit including a plurality of signal delay lines, where each delay line delays the digital signal a predetermined period of time representing a rotational shift of the constellation point on the constellation, said phase control circuit further including a first multiplexer coupled to the delay lines at its input and receiving a phase control signal from the digital source that selects a particular delayed digital signal at an output of the first multiplexer for the constellation point to be transmitted;
   an amplitude control circuit including a plurality of pulse width adjust circuits responsive to the delayed digital signal from the first multiplexer, said pulse width adjust circuits adjusting a width of the pulses in the signal where the width of the pulses identifies a ring in the constellation that the constellation point is located on, said amplitude control circuit including a second multiplexer coupled to the pulse width adjust circuits at its input digital signals at its input and receiving an amplitude control signal from the digital source that selects a particular pulse width adjusted digital signal at an output of the second multiplexer for the constellation point to be transmitted;

a saturated amplifier responsive to the amplitude controlled digital signal from the second multiplexer and amplifying the digital signal where the amplifier operates in saturation so that it is only using power when logical one pulses are being provided to the amplifier;

a filter responsive to the amplified digital signal from the amplifier, said amplifier integrating and averaging the digital signal to remove noise from the signal so as to convert the digital signal to an analog signal; and an antenna responsive to the analog signal from the filter to transmit the analog signal.

2. The modulation circuit according to claim 1 wherein the filter is a high Q filter.

3. The modulation circuit according to claim 1 wherein the amplifier is selected from the group consisting of solid state power amplifiers and traveling wave tube amplifiers.

4. The modulation circuit according to claim 1 wherein the digital source provides an oversampled digital signal that includes multiple consecutive sample values.

5. The modulation circuit according to claim 4 wherein the digital source gradually tapers the width of the pulses in the digital signal so as to cause the filter to integrate less energy and reduce its power consumption and spurious energy.

6. The modulation circuit according to claim 4 wherein the digital source decimates some of the pulses in the digital signal so as to reduce the power requirements of the amplifier.

7. The modulation circuit according to claim 4 wherein the digital source excises one or more of the pulses in the digital signal so as to reduce the pulse width and the power requirements of the amplifier.

8. The modulation circuit according to claim 4 wherein the digital source converts one or more pulses in the digital signal into multiple narrower pulses so as to reduce the power requirements of the amplifier.

9. An amplitude and phase modulation circuit for modulating an M-ary digital signal having pulses, said modulation circuit comprising:

a digital source generating a digital signal including pulses representing logical 1s and no pulses representing logical zeros, where a group of M pulses represents a constellation point to be transmitted;

a phase control circuit responsive to the digital signal from the digital source, said phase control circuit including a plurality of signal delay lines, where each delay line delays the digital signal a predetermined period of time representing a rotational shift of the constellation point on the constellation, said phase control circuit further including a multiplexer coupled to the delay lines at its input and receiving a phase control signal from the digital source that selects a particular delayed digital signal at an output of the multiplexer for the constellation point to be transmitted;

a saturated amplifier responsive to the phase controlled digital signal from the second multiplexer and amplifying the digital signal where the amplifier operates in saturation so that it is only using power when logical one pulses are being provided to the amplifier;

a filter responsive to the amplified digital signal from the amplifier, said amplifier integrating and averaging the digital signal to remove noise from the signal so as to convert the digital signal to an analog signal; and an antenna responsive to the analog signal from the filter to transmit the analog signal.

10. The modulation circuit according to claim 9 wherein the digital source provides an oversampled digital signal that includes multiple consecutive sample values.

11. The modulation circuit according to claim 10 wherein the digital source gradually tapers the width of the pulses in the digital signal so as to cause the filter to integrate less energy and reduce its power consumption and spurious energy.

12. The modulation circuit according to claim 10 wherein the digital source decimates some of the pulses in the digital signal so as to reduce the power requirements of the amplifier.

13. The modulation circuit according to claim 10 wherein the digital source excises one or more of the pulses in the digital signal so as to reduce the pulse width and the power requirements of the amplifier.

14. The modulation circuit according to claim 10 wherein the digital source converts one or more pulses in the digital signal into multiple narrow pulses so as to reduce the power requirements of the amplifier.

15. An amplitude and phase modulation circuit for modulating an M-ary digital signal having pulses, said modulation circuit comprising:

a digital source generating a digital signal including pulses representing logical 1s and no pulses representing logical zeros, where a group of M pulses represents a constellation point to be transmitted;

an amplitude control circuit including a plurality of pulse width adjust circuits responsive to the digital signal, said pulse width adjust circuits adjusting a width of the pulses in the signal where the width of the pulses identifies a ring in the constellation that the constellation point is located on, said amplitude control circuit including a multiplexer coupled to the pulse width adjust circuits at its input digital signals at its input and receiving an amplitude control signal from the digital source that selects a particular pulse width adjusted digital signal at an output of the multiplexer for the constellation point to be transmitted;

a saturated amplifier responsive to the amplitude controlled digital signal from the multiplexer and amplifying the digital signal where the amplifier operates in saturation so that it is only using power when logical one pulses are being provided to the amplifier;

a filter responsive to the amplified digital signal from the amplifier, said amplifier integrating and averaging the digital signal to remove noise from the signal so as to convert the digital signal to an analog signal; and an antenna responsive to the analog signal from the filter to transmit the analog signal.

16. The modulation circuit according to claim 15 wherein the digital source provides an oversampled digital signal that includes multiple consecutive sample values.

17. The modulation circuit according to claim 16 wherein the digital source gradually tapers the width of the pulses in the digital single so as to cause the filter to integrate less energy and reduce its power consumption and sprious energy.

18. The modulation circuit according to claim 16 wherein the digital source decimates some of the pulses in the digital signal so as to reduce the power requirements of the amplifier.

19. The modulation circuit according to claim 16 wherein the digital source excises one or more of the pulses in the digital signal so as to reduce the pulse width and the power requirements of the amplifier.

20. The modulation circuit according to claim 16 wherein the digital source converts one or more pulses in the digital signal into multiple narrower pulses so as to reduce the power requirements of the amplifier.

\* \* \* \* \*